(12) United States Patent
Parikh et al.

(10) Patent No.: US 7,687,308 B2
(45) Date of Patent: Mar. 30, 2010

(54) METHOD FOR FABRICATING CARBON NANOTUBE TRANSISTORS ON A SILICON OR SOI SUBSTRATE

(75) Inventors: Ashesh Parikh, Frisco, TX (US); Andrew Marshall, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/192,457

(22) Filed: Aug. 15, 2008

(65) Prior Publication Data
US 2010/0038627 A1 Feb. 18, 2010

(51) Int. Cl.
*H01L 51/40* (2006.01)
*H01L 21/336* (2006.01)

(52) U.S. Cl. .................. 438/99; 438/285; 257/E51.04; 977/842; 977/845; 977/938

(58) Field of Classification Search .............. 438/99, 438/285; 257/E51.04; 977/842, 845, 938
See application file for complete search history.

(56) References Cited

U.S. PATENT DOCUMENTS

2009/0256130 A1* 10/2009 Schricker ................. 257/4
2009/0256131 A1* 10/2009 Schricker ................. 257/4
2009/0278112 A1* 11/2009 Schricker et al. .......... 257/9

\* cited by examiner

*Primary Examiner*—Ngan Ngo
(74) *Attorney, Agent, or Firm*—Jacqueline J. Garner; Wade J. Brady, III; Frederick J. Telecky, Jr.

(57) ABSTRACT

A method of forming a single wall thickness (SWT) carbon nanotube (CNT) transistor with a controlled diameter and chirality is disclosed. A photolithographically defined single crystal silicon seed layer is converted to a single crystal silicon carbide seed layer. A single layer of graphene is formed on the top surface of the silicon carbide. The SWT CNT transistor body is grown from the graphene layer in the presence of carbon containing gases and metal catalyst atoms. Silicided source and drain regions at each end of the silicon carbide seed layer provide catalyst metal atoms during formation of the CNT. The diameter of the SWT CNT is established by the width of the patterned seed layer. A conformally deposited gate dielectric layer and a transistor gate over the gate dielectric layer complete the CNT transistor. CNT transistors with multiple CNT bodies, split gates and varying diameters are also disclosed.

6 Claims, 17 Drawing Sheets

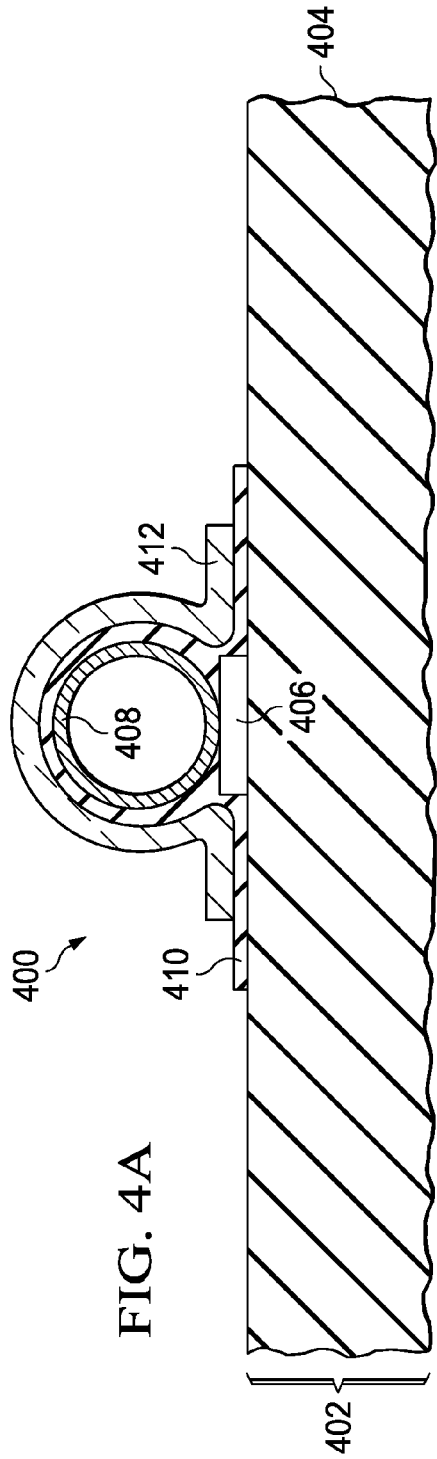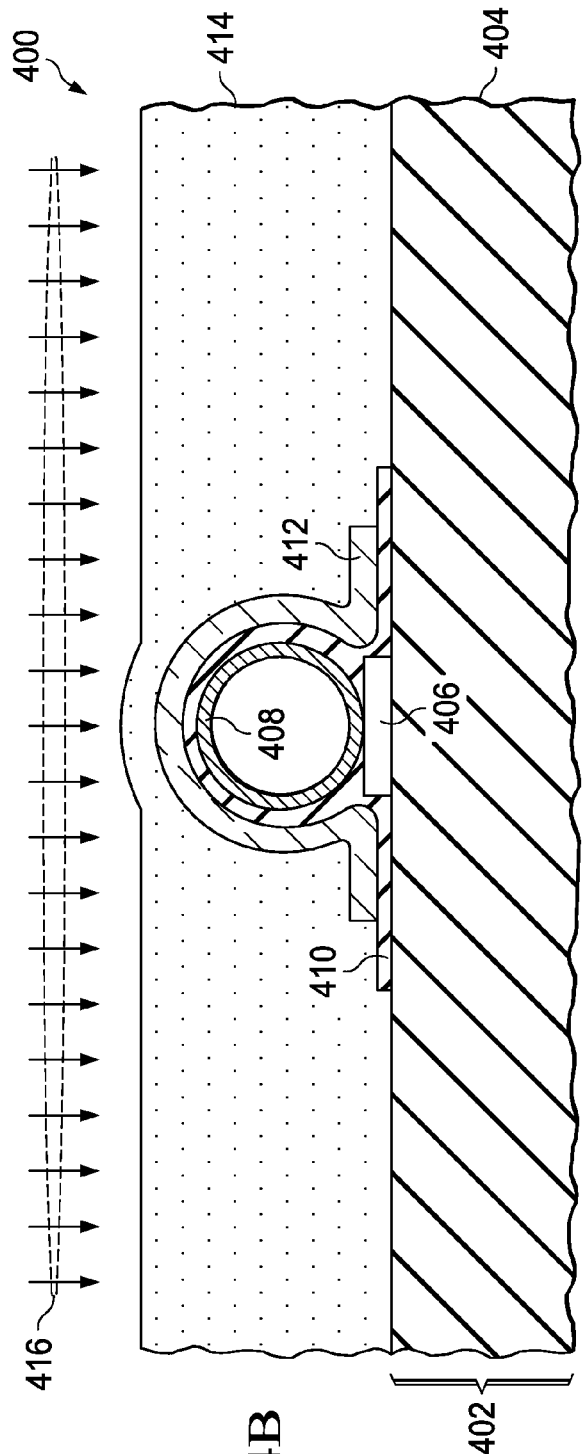

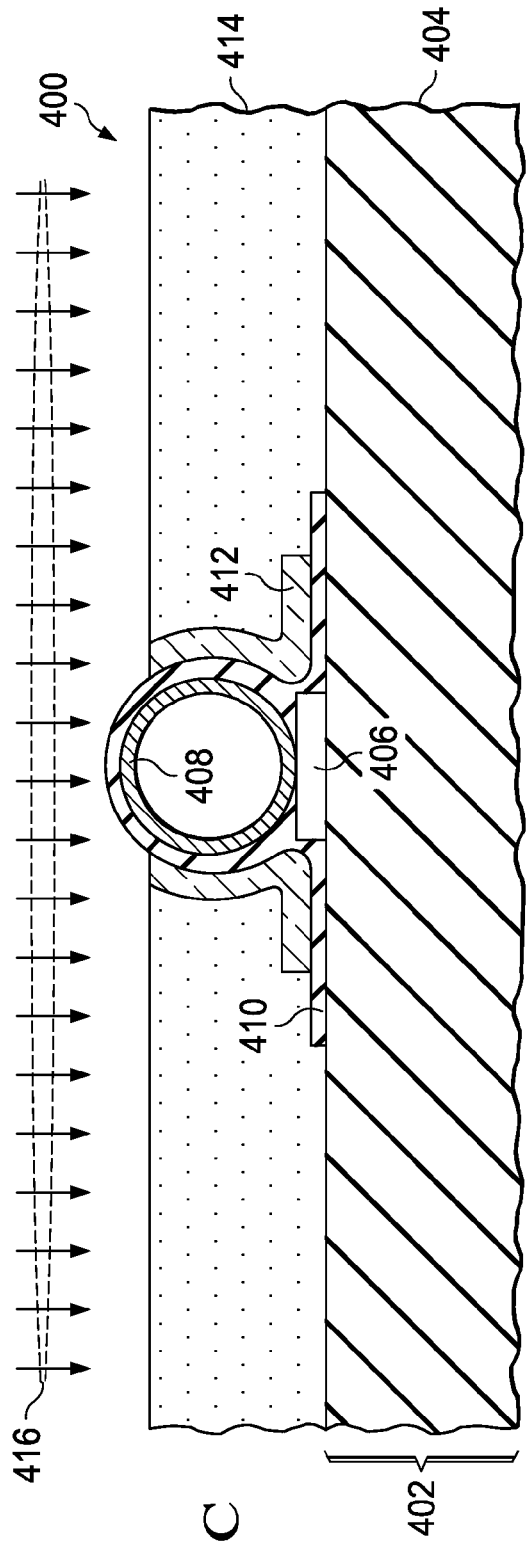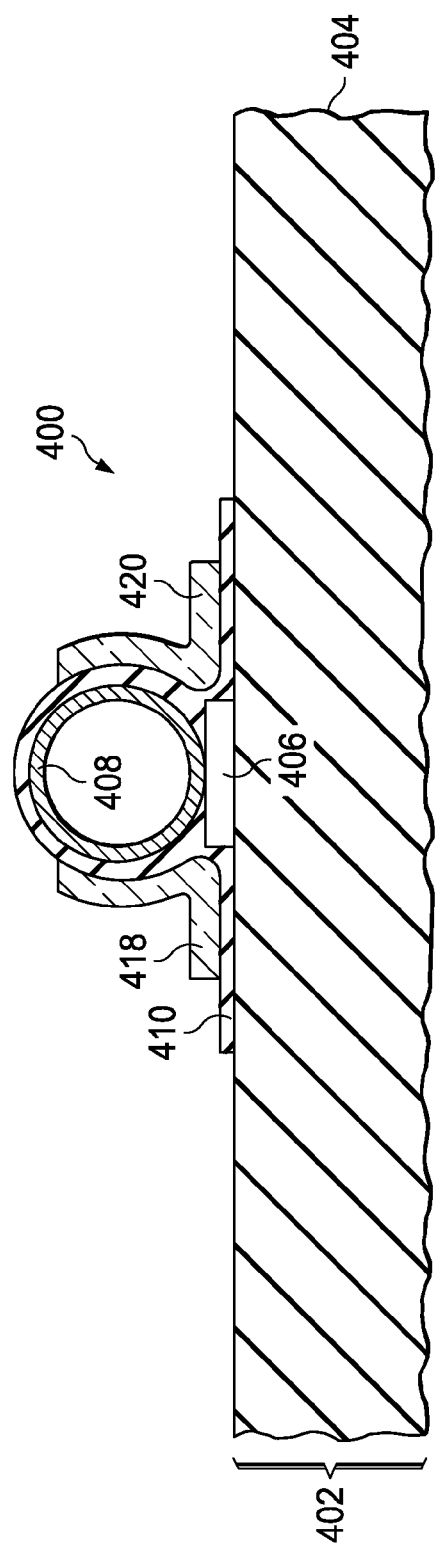
FIG. 4C
FIG. 4D

METHOD FOR FABRICATING CARBON NANOTUBE TRANSISTORS ON A SILICON OR SOI SUBSTRATE

CROSS-REFERENCE TO RELATED APPLICATIONS

This invention relates to application Ser. No. 12/015,358, filed Jan. 16, 2008.

FIELD OF THE INVENTION

This invention relates to the field of integrated circuits. More particularly, this invention relates to methods to fabricate carbon nanotube transistors in integrated circuits.

BACKGROUND OF THE INVENTION

Carbon nanotube (CNT) transistors may exhibit desirable properties, including fast switching speeds. Integrating CNT transistors in integrated circuits (ICs) has been problematic, in part due to difficulty controlling the diameter and chirality of the CNT used to form the transistor body. Chirality, the alignment of the carbon hexagons in the CNT, affects transport properties of charge carriers in the CNT transistor. The CNT diameter also affects charge transport parameters of the CNT transistor, as well as IC fabrication cost and complexity.

SUMMARY OF THE INVENTION

This Summary is provided to comply with 37 C.F.R. §1.73, requiring a summary of the invention briefly indicating the nature and substance of the invention. It is submitted with the understanding that it will not be used to interpret or limit the scope or meaning of the claims.

The instant invention provides a method of forming single wall thickness (SWT) carbon nanotube (CNT) transistors in integrated circuits (ICs). An area of thin single crystal silicon on an isolation layer is patterned and etched to produce a single crystal silicon seed layer. Thicker source and drain regions at each end of the silicon seed layer are silicided. The silicon seed layer is converted to single crystal silicon carbide by known methods. A single layer of graphene is formed on the top surface of the silicon carbide seed layer by removing silicon using ablation, thermal desorption or other methods. The IC is then heated whiled being exposed to carbon containing gases and catalytic metals so as to extend the graphene layer at its lateral edges, forming an SWT CNT on the silicon carbide seed layer. Metal atoms from the silicided source/drain regions act advantageously as a catalyst for formation of the CNT. A gate dielectric layer is deposited on the CNT body element, followed by formation of a transistor gate on a top surface of the gate dielectric layer.

The inventive CNT transistor may be formed with one or more CNT elements forming the body of the transistor. The CNT body elements may be closely spaced, providing a planar gate structure, or widely spaced so that the gate controls a larger portion of the CNT periphery. The gate may be split to provide a more versatile CNT transistor for logic gate layouts or analog circuits. Transistor performance parameters such as on-state drive current, off-state leakage current and threshold voltage are functions of the diameters of the CNT transistor body. Separate transistors with different diameters of CNT body elements may fabricated concurrently in the IC.

An advantage of the instant invention is that a diameter and chirality of the CNT transistor body is established by a width and crystal orientation of the silicon seed layer. Transistor performance parameters such as bandgap and threshold are functions of the CNT diameter and chirality, so the capability of forming CNT with varying diameters desirably enables transistors of varying performance parameters to be formed concurrently in an IC, without adding fabrication cost or complexity.

DESCRIPTION OF THE VIEWS OF THE DRAWING

FIG. 4A through FIG. 4E are cross-sections of an IC containing a split gate CNT transistor in a fourth embodiment of the instant invention, depicted in successive stages of fabrication.

DETAILED DESCRIPTION

Figure 1A:
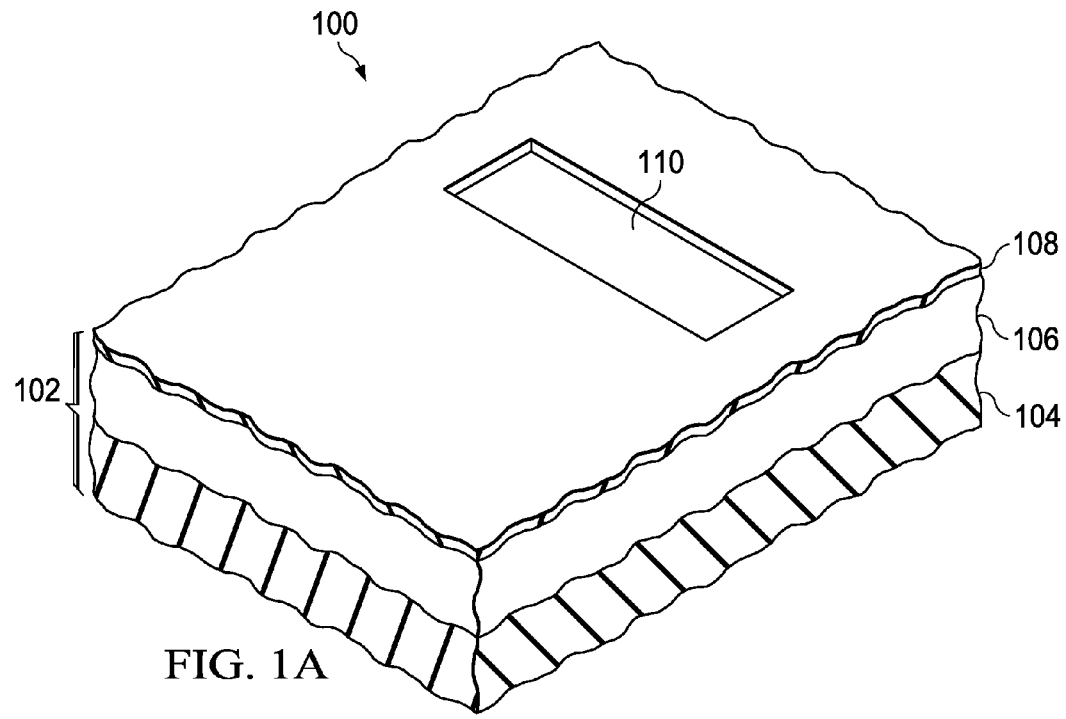
FIG. 1A through FIG. 1K are cutaway perspectives of an IC containing a CNT transistor formed according to a first embodiment of the instant invention, depicted in successive stages of fabrication.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The instant invention provides a method of forming a carbon nanotube (CNT) transistor in an integrated circuit (IC) in which a patterned seed layer of single crystal silicon is formed in an area defined for a CNT transistor body. Source and drain regions at each end of the area defined for the CNT transistor body are silicided, providing catalyst metal for formation of the CNT. The single crystal silicon seed layer is converted to single crystal silicon carbide by known methods such as exposing the silicon seed layer to heat and a gaseous source of carbon. In a further process step, a single layer of graphene, which is a one-atom-thick planar sheet of $sp^2$-bonded carbon atoms that are densely packed in a honeycomb crystal lattice, is formed on the top surface of the silicon carbide seed layer by known methods, possibly including removing silicon from a top region of the silicon carbide using ablation, thermal desorption or other methods. The SWT CNT is subsequently formed by heating the IC while exposing the graphene to carbon containing gases and catalytic metals so as to extend the graphene layer at its lateral edges, forming the SWT CNT on the silicon carbide seed layer. A diameter of the SWT CNT is substantially established by a width of the silicon carbide seed layer, and a chirality of the SWT CNT, which is an alignment of hexagonal cells in the graphene honeycomb around a perimeter of the SWT CNT, is substantially established by a crystal orientation of the silicon carbide seed layer. Metal atoms from the silicided source/drain regions act advantageously as a catalyst for formation of the CNT. A diameter and chirality of the SWT CNT are established by a width and orientation of the silicon carbide seed layer. A conductivity type of the CNT, that is n-type or p-type, may be established by known methods during subsequent processing. A gate dielectric layer is deposited on the CNT body element, followed by formation of a transistor gate on a top surface of the gate dielectric layer.

The inventive CNT transistor may be formed with one or more CNT elements forming the body of the transistor. The CNT body elements may be closely spaced, providing a planar gate structure, or widely spaced so that the gate controls a larger portion of the CNT periphery. The gate may be split to provide a more versatile CNT transistor for logic gate layouts or analog circuits. More than one diameter of CNT body element may fabricated concurrently in the IC.

FIG. 1A through FIG. 1J are cutaway perspectives of an IC containing a CNT transistor formed according to a first embodiment of the instant invention, depicted in successive stages of fabrication. Referring to FIG. 1A, the IC (100) is formed on a substrate (102) which may be a silicon-on-insulator (SOI) wafer, as depicted in FIG. 1A, a single crystal silicon substrate, or other semiconductor substrate appropriate for fabrication of the IC (100). An isolation layer (104), which may be a layer of silicon dioxide in an SOI wafer, or an implanted layer in a single crystal silicon substrate, underlies a single crystal silicon layer (106) which is preferably between 100 and 300 nanometers thick. A layer of silicide block dielectric (108), preferably silicon nitride between 10 and 50 nanometers thick, but possibly silicon dioxide or other material, is formed on a top surface of the single crystal silicon layer (106) by known deposition methods, including low pressure chemical vapor deposition (LPCVD) and plasma enhanced chemical vapor deposition (PECVD). A source/drain area (110) is defined by a source/drain photoresist pattern, not shown in FIG. 1A for clarity, and silicide block material is removed from the source/drain area (110) by known dielectric etching methods, to expose the single crystal silicon layer (106). A second source/drain area is defined opposite the first source/drain area (110) across the cross-section plane of FIG. 1A, and is not shown in FIG. 1A for clarity.

Figure 1B:
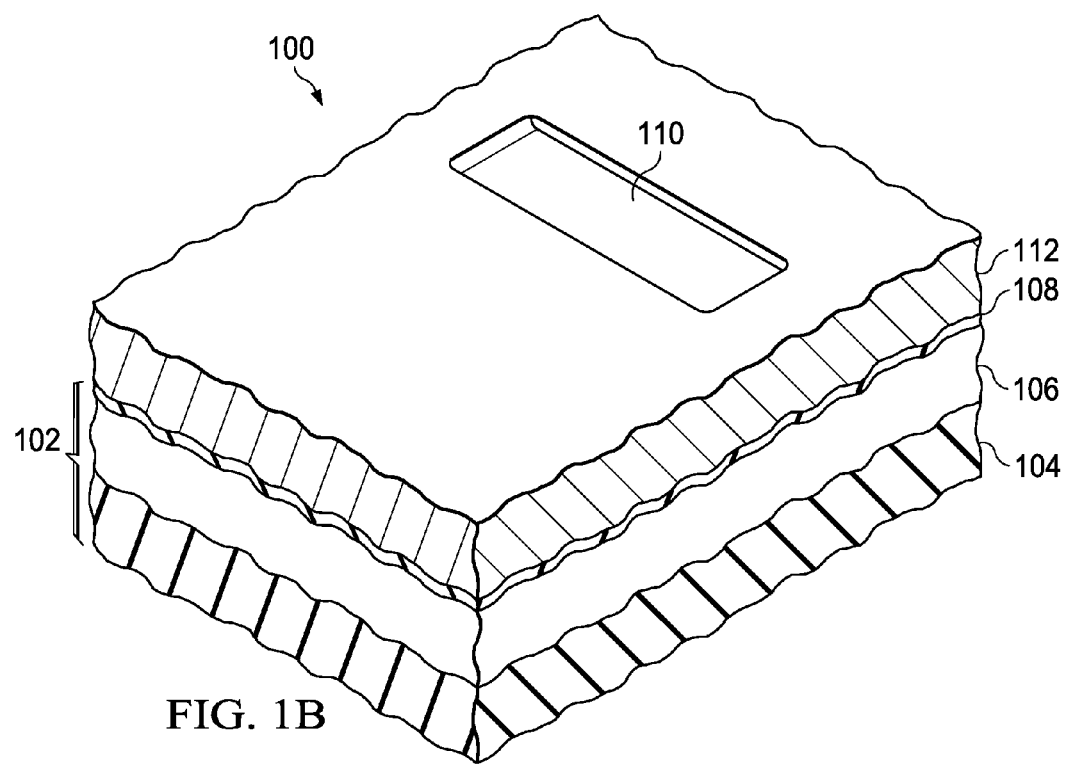

FIG. 1B depicts the IC (100) after deposition of a metal layer (112), with an optional cap layer, not shown in FIG. 1B for clarity, to provide a source of metal for formation of metal silicide in a subsequent fabrication step. The metal layer (112) is preferably nickel, but is possibly cobalt, titanium or platinum, or other metal capable of forming a metal silicide with desired electrical and CNT catalytic properties, preferably between 150 and 500 nanometer thick. The metal layer is preferably deposited in a conformal manner using known metal deposition methods, such as sputtering, to provide substantially complete coverage of the exposed single crystal silicon layer (106) in the source/drain area (110).

Figure 1C:
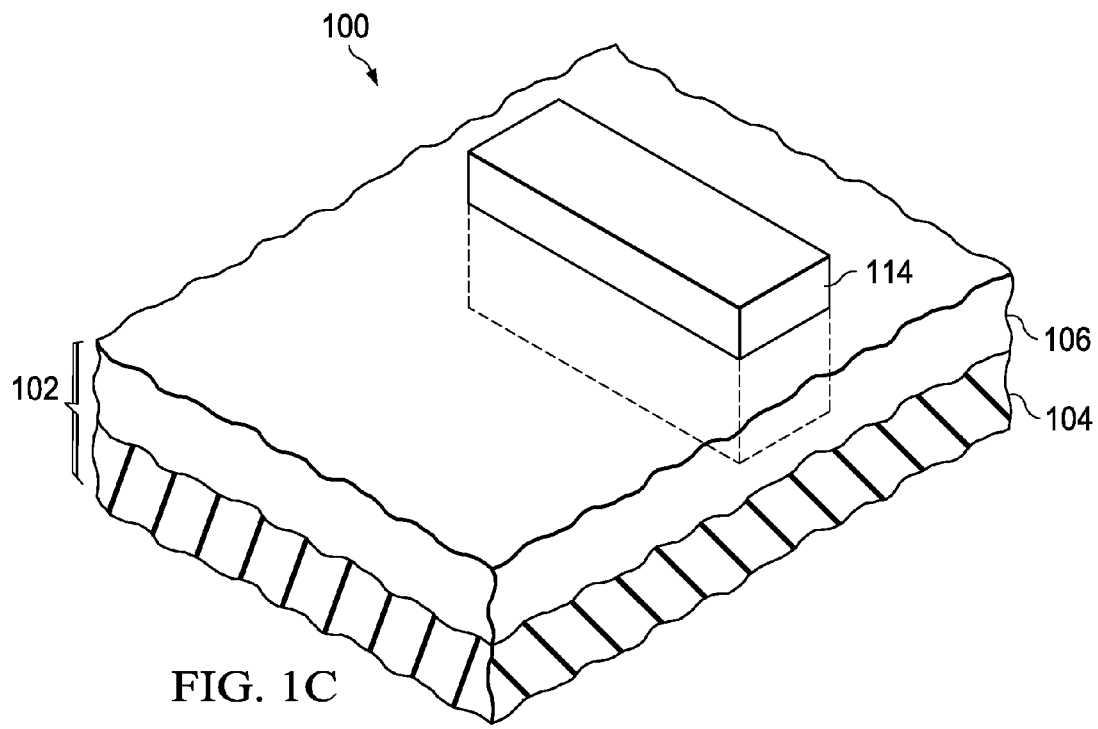

FIG. 1C depicts the IC (100) after a metal silicide formation process in which the IC (100) is heated to react the metal depicted in FIG. 1B with exposed silicon in the single crystal silicon layer (106) to form a metal silicide, for example, nickel silicide, using known metal silicide methods. Details of the metal silicide formation process vary considerably with the type of metal used. Unreacted metal, for example, unreacted nickel, is removed from the IC (100) by known metal removal methods, such as etching the unreacted metal in a mixture of sulfuric acid and hydrogen peroxide. The silicide block layer is removed from the IC (100), to leave a silicided source/drain region (114) in the source/drain area, preferably extending to the isolation layer (104).

Figure 1D:
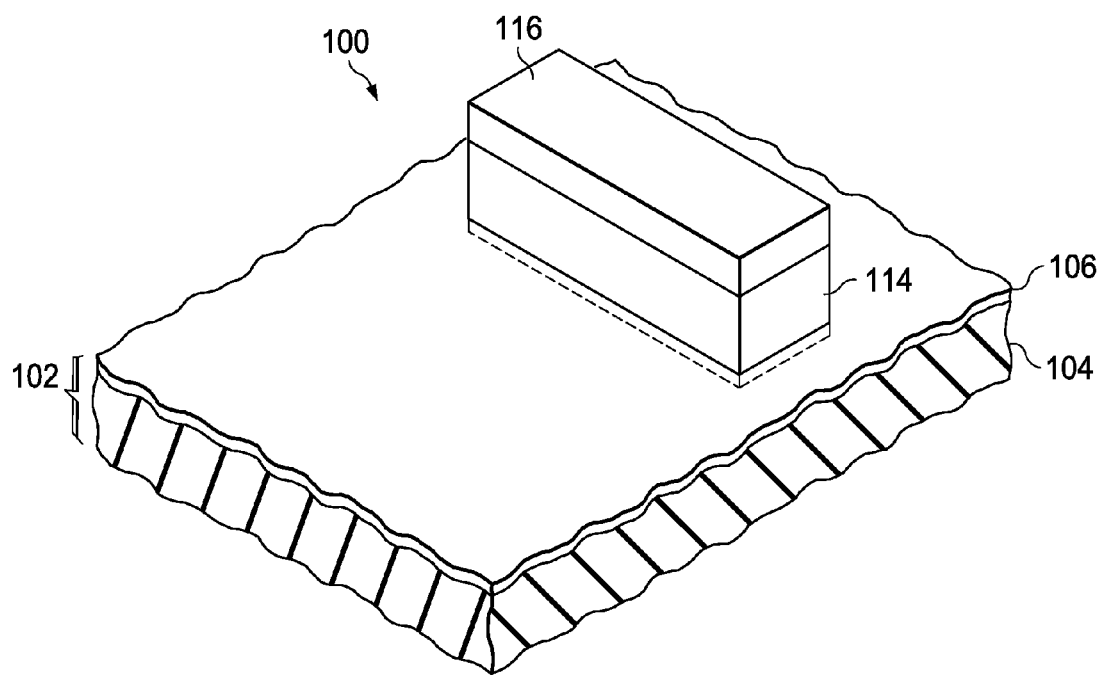

FIG. 1D depicts the IC (100) after a silicon etch process which removes most of the exposed silicon in the single crystal silicon layer (106) around the silicided source/drain region (114). A silicon etch photoresist pattern (116) formed on a top surface of the silicided source/drain region (114) prevents etching of the silicided source/drain region (114) during the silicon etch process. A thickness of exposed silicon in the single crystal silicon layer (106) remaining on the isolation layer (104) is preferably 1 to 3 nanometers, but may be more in other embodiments. The silicon etch photoresist pattern (116) is removed prior to subsequent processing, using known photoresist removal methods, possibly including exposing the IC (100) to an oxygen containing plasma, followed by a wet cleanup to remove any organic residue from the top surface of the silicided source/drain region (114).

Figure 1E:
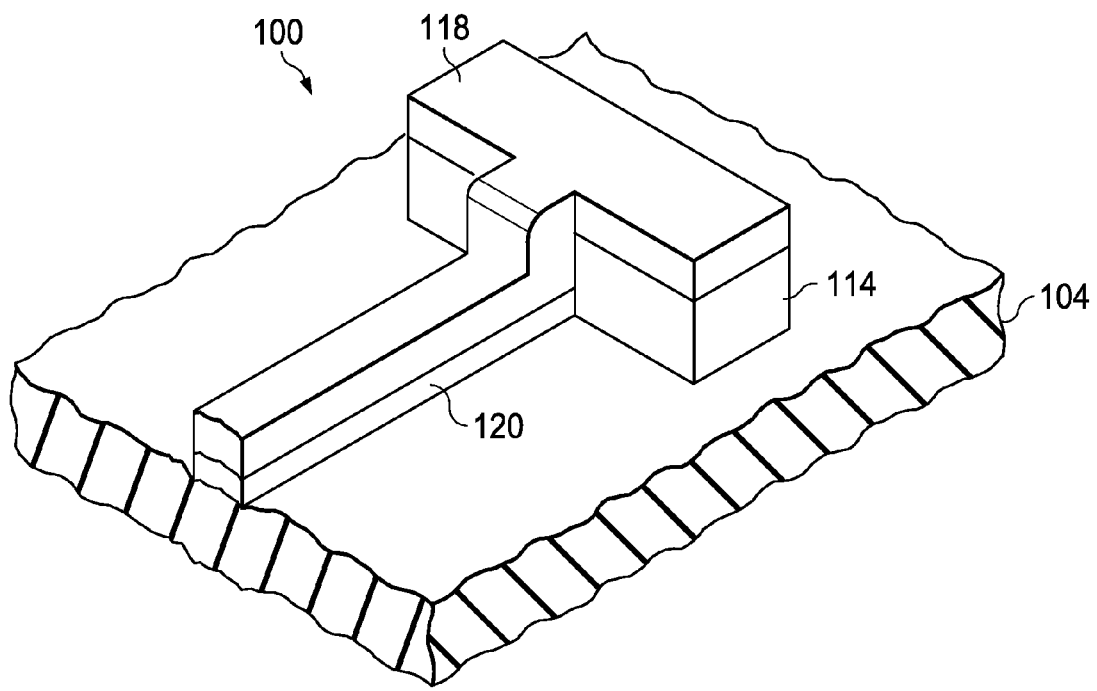

FIG. 1E depicts the IC (100) during a process sequence to define a single crystal silicon seed layer for a CNT. A CNT seed layer photoresist pattern (118) is formed on a top surface of the exposed silicon in the single crystal silicon layer in an area defined for a CNT seed layer, and possibly on the top surface of the silicided source/drain region (114). A silicon etch process is performed which removes exposed silicon from the top surface of the isolation layer (104) outside the area defined for the CNT seed layer, to leave a CNT single crystal silicon seed layer (120) in the single crystal silicon. The CNT seed layer photoresist pattern (118) is removed prior to subsequent processing, using known photoresist removal methods, possibly including exposing the IC (100) to an oxygen containing plasma, followed by a wet cleanup to remove any organic residue from the top surface of the CNT seed layer (120). The silicon seed layer (120) is preferably 1 to 3 nanometers thick.

Figure 1F:
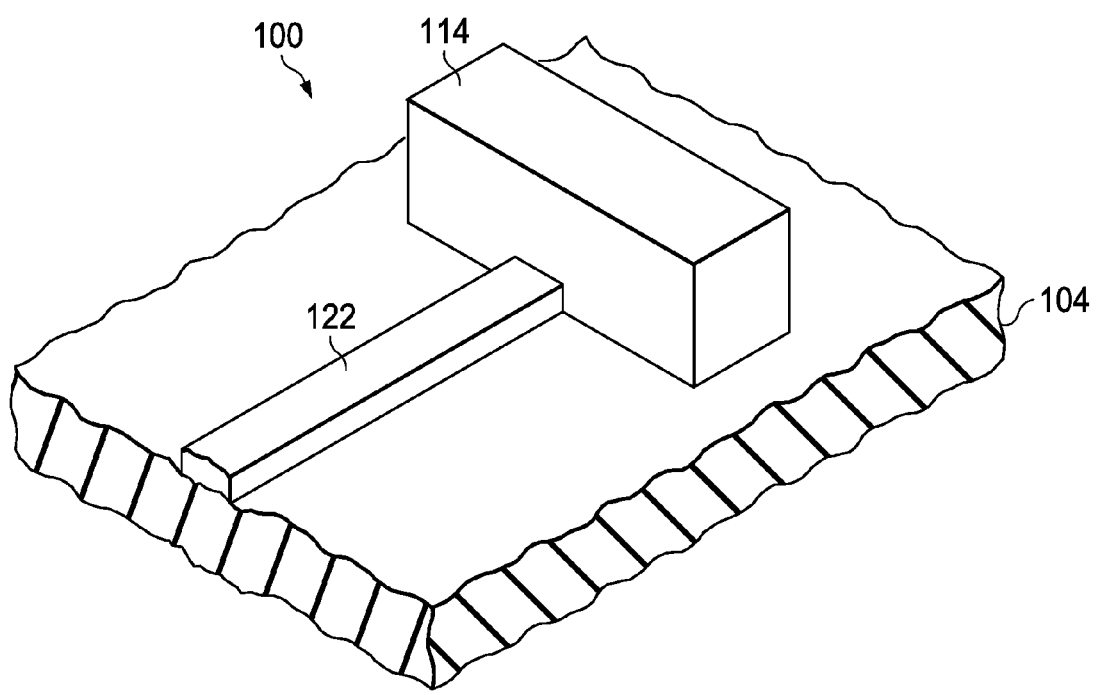

FIG. 1F depicts the IC (100) after conversion of the silicon in the silicon seed layer to silicon carbide, to form a single crystal silicon carbide seed layer (122) on a top surface of the isolation layer (104). The silicon carbide seed layer (122) is preferably in the hexagonal phase, and is formed by known processes, for example by exposing the IC (100) to a mixture of 90% to 99.5% hydrogen gas, 0.1% to 5% silicon halide gas, 0.1% to 5% hydrocarbon gas, and 0.01% to 1% water vapor while the IC (100) is heated to approximately 1200 C.

Figure 1G:
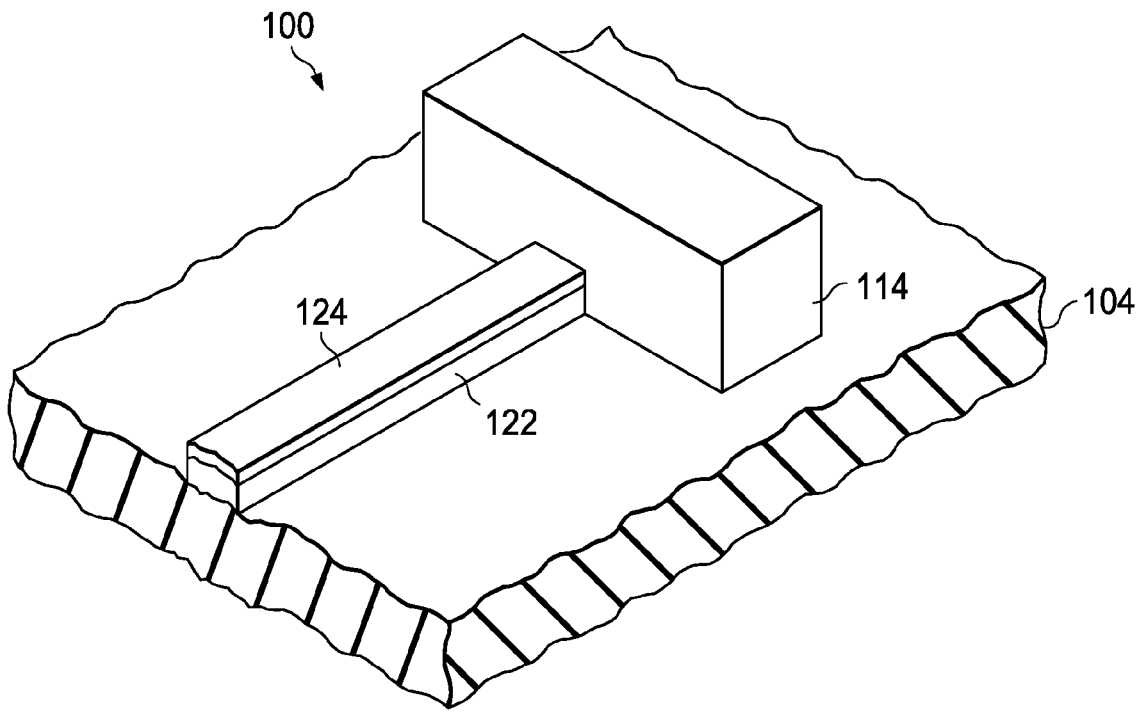

FIG. 1G depicts the IC (100) after formation of a single layer of graphene (124) on a top surface of the silicon carbide seed layer (122). The graphene is formed on the top surface of the silicon carbide seed layer by known methods, possibly including removing silicon from a top region of the silicon carbide using laser ablation, thermal desorption, for example by heating the IC (100) to between 1000 C and 1400 C for 20 minutes in a vacuum less than $10^{-6}$ torr, or other methods. In a preferred embodiment, the graphene layer (124) extends to lateral edges of the silicon carbide seed layer (122). An orientation of the honeycomb lattice of the graphene is established by a crystal orientation of the silicon carbide seed layer (122).

Figure 1H:
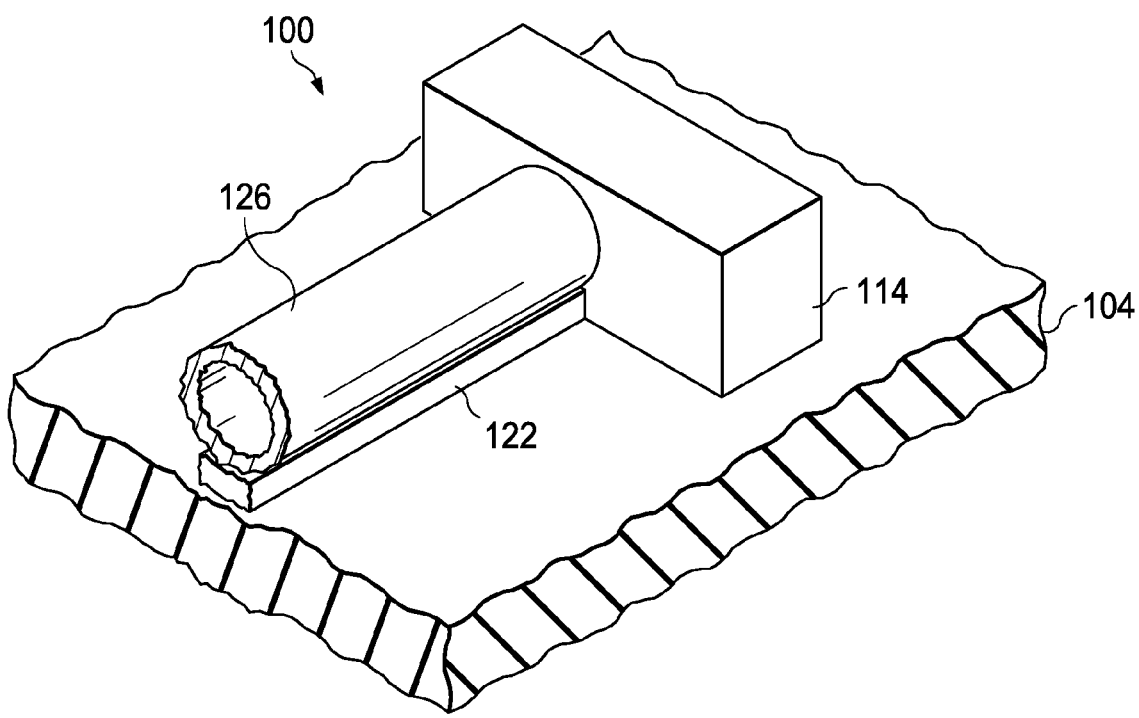

FIG. 1H depicts the IC (100) after formation of a CNT transistor body (126) from the graphene layer depicted in FIG. 1G. The CNT transistor body (126) is formed in a single-wall configuration using known processes, for example by exposing the graphene layer (124) to carbon containing gases and catalytic metals while being heated between 1100 C and 1400 C, so as to grow more graphene at lateral edges of the graphene layer (124). In a preferred embodiment, the formation of the CNT is performed in a manner that desirably provides metal atoms from the silicided source/drain region (114) to act in a catalytic manner to promote the formation of the CNT (126). A chirality of the CNT transistor body (126) is desirably established by an orientation of the single crystal silicon seed layer (120) such that the CNT transistor body (126) has a semiconductor electrical form. Furthermore, a radius of the CNT transistor body (126) is desirably determined by a width of the single crystal silicon seed layer (120), which in turn establishes a bandgap energy of the CNT transistor body (126). Electrical properties of the CNT transistor body are also affected by the particular metal present in the silicided source/drain region (114). The conductivity type, n-type or p-type, of the CNT transistor body (126) may be established with subsequent processing using known methods, prior to formation of a gate dielectric layer on the CNT transistor body (126).

Figure 1I:
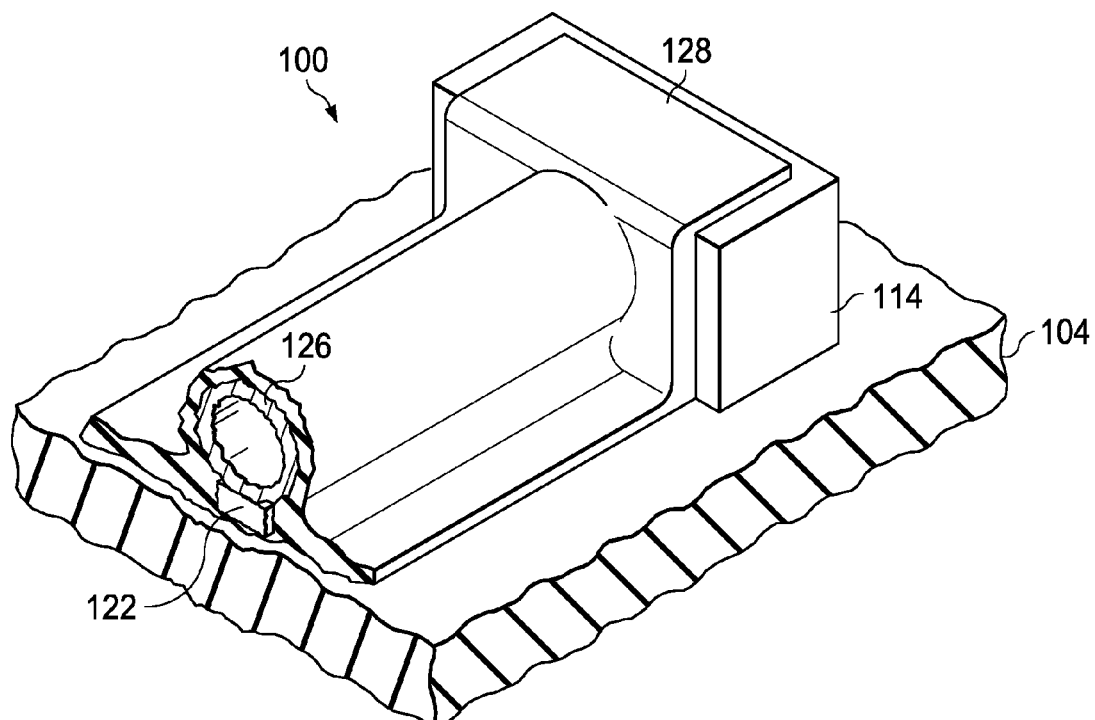

FIG. 1I depicts the IC (100) after formation of a gate dielectric layer (128) on an exterior surface of the CNT transistor body (126). The gate dielectric layer (128) is formed of known transistor gate materials, including silicon dioxide, nitrogen doped silicon dioxide, silicon oxy-nitride, hafnium oxide, layers of silicon dioxide and silicon nitride, or other insulating material, and deposited by known gate material deposition processes. It will be recognized by those familiar with CNT devices that the gate dielectric layer (128) is not formed in a manner similar to gate oxides grown on silicon substrates, in that formation of the gate dielectric layer (128) does not consume CNT material in the CNT transistor body (126). The gate dielectric layer (128) may optionally overlap the silicided source/drain region (114). The gate dielectric layer may optionally be patterned prior to subsequent fabrication steps, or may be patterned later in the fabrication process sequence.

Figure 1J:
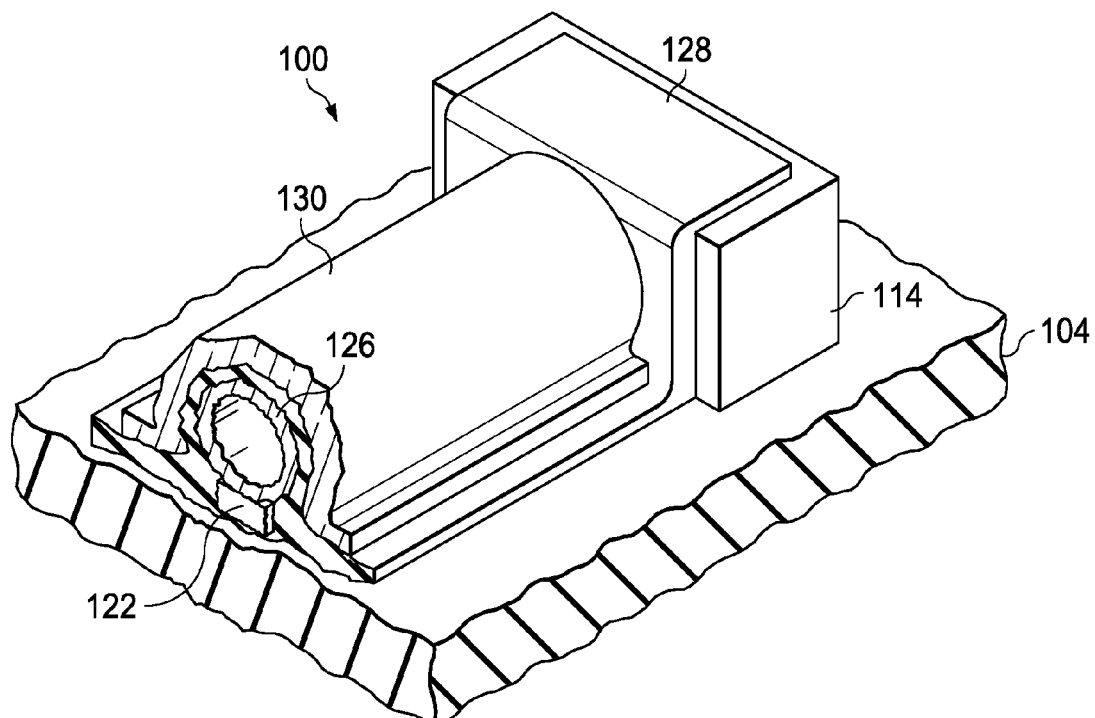
Figure 1K:
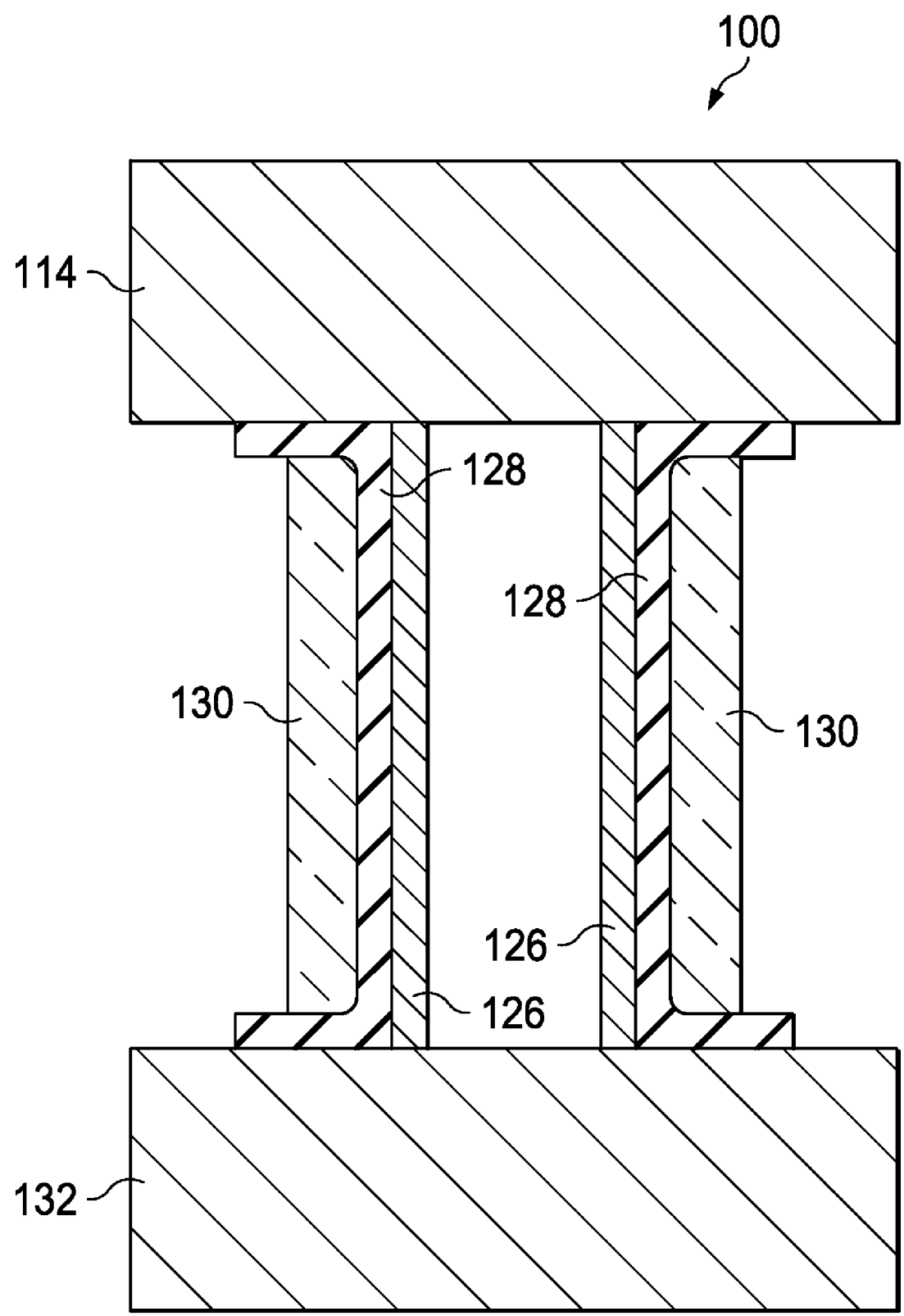

FIG. 1J depicts the IC (100) after formation of a transistor gate (130) on an exterior surface of the gate dielectric layer (128). The transistor gate (130) may be formed of any conductor material with a desired work function which is compatible with the CNT transistor body (126), such as polycrystalline silicon, commonly known as polysilicon. The silicided source/drain region (114) in conjunction with the second silicided source/drain region which is not shown in FIG. 1I for clarity, the CNT transistor body (126), the gate dielectric layer (128) and the transistor gate (130) form the inventive CNT transistor, which may be n-channel or p-channel according to process operations executed on the CNT transistor body (126).

Formation of the single crystal silicon carbide seed layer in a self aligned manner from the single crystal silicon seed layer which is photolithographically defined is advantageous because the chirality and diameter of the CNT transistor body (126) are desirably reproducible in multiple instances of the inventive CNT transistor in the IC (100). Reproducibility of the chirality and diameter of the CNT transistor body (126) is furthermore advantageous because several performance parameters of the CNT transistor are substantially affected by the chirality and diameter of the CNT transistor body (126), including a threshold voltage, on-state drive current and off-state leakage current.

Furthermore, provision of catalytic metal atoms from the silicided source/drain region (114) during formation of the CNT transistor body (126) is advantageous because a consistency of the CNT is improved.

In an alternate embodiment, a first IC may be formed on a first substrate using a first metal, for example nickel, in silicided source/drain regions to obtain a first set of transistor properties, and a second IC may be formed on a second substrate using a second metal, for example cobalt, in silicided source/drain regions to obtain a second set of transistor properties. This is advantageous because it provides increased IC performance range with minimal increased fabrication costs.

Figure 2A:
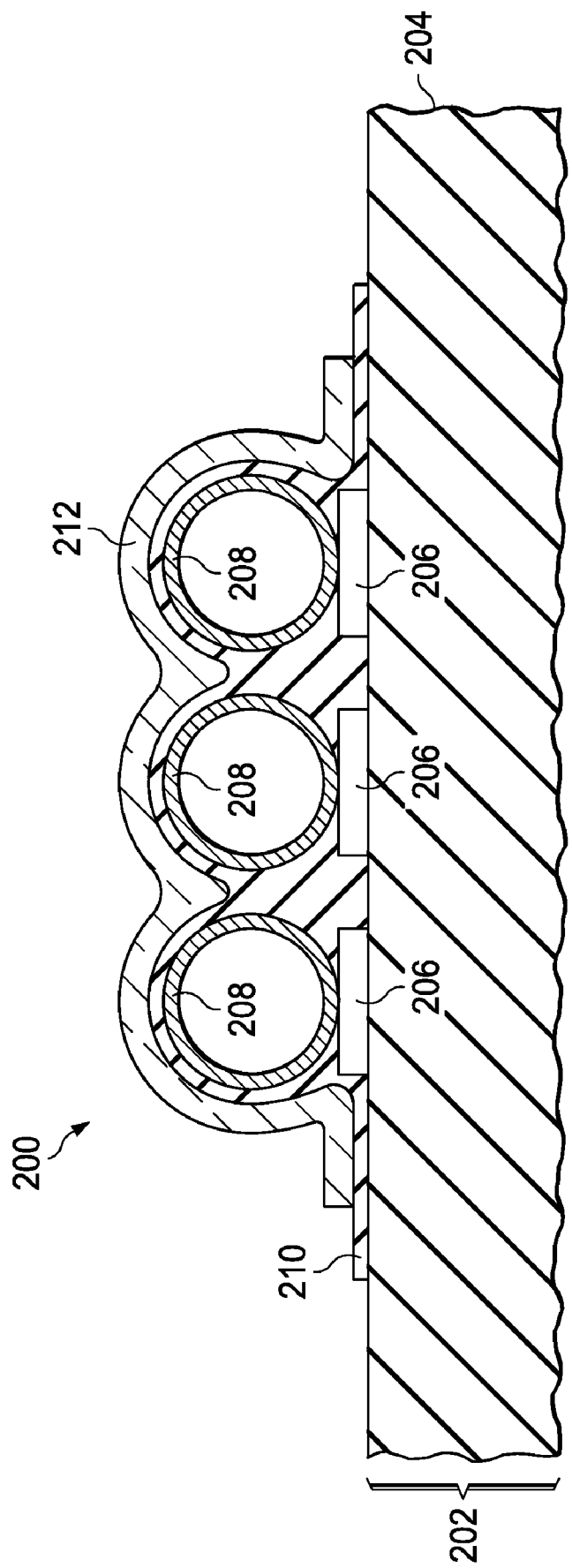
FIG. 2 is a cross-section of an IC containing a second embodiment of the CNT transistor.
Figure 2B:
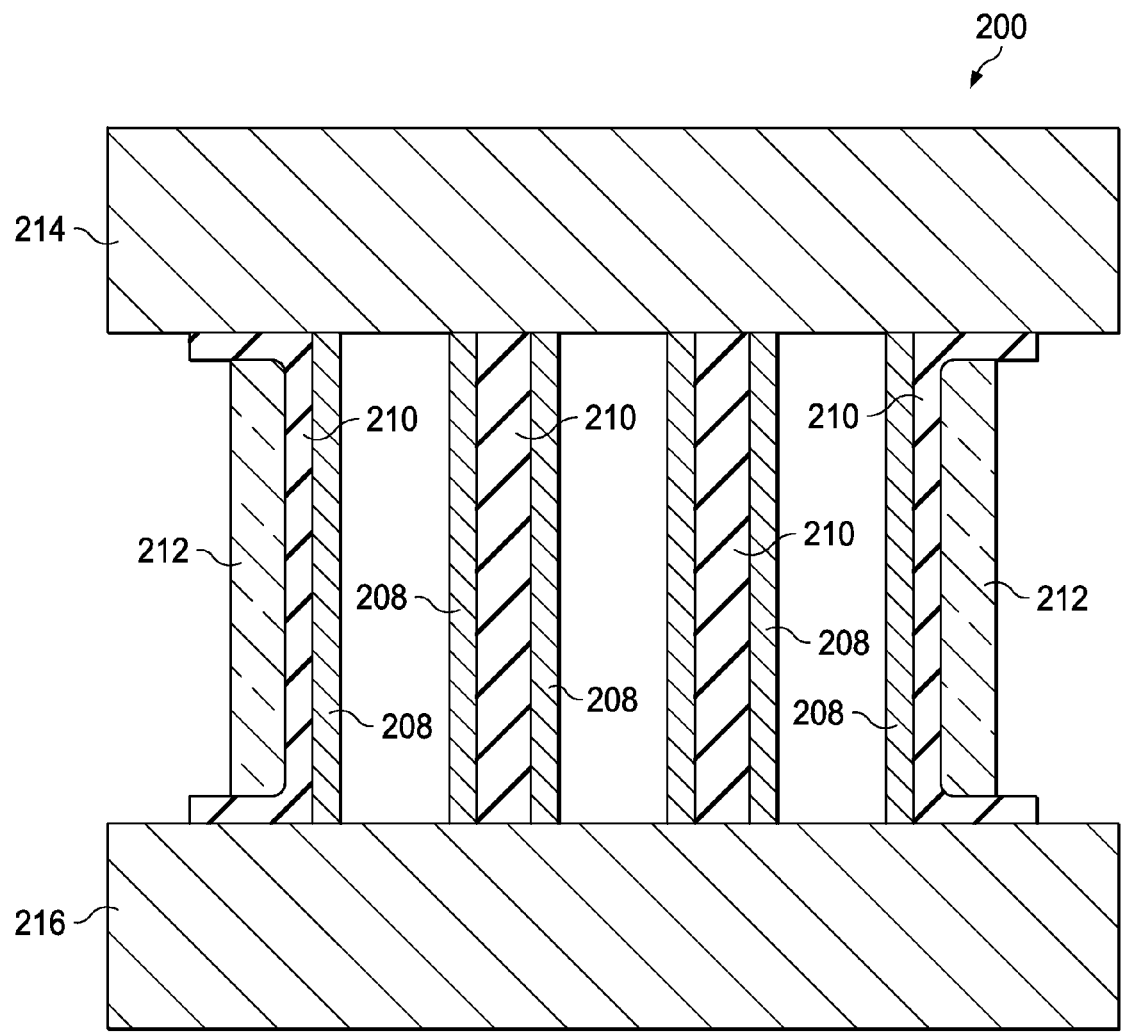

FIG. 2 is a cross-section of an IC containing a second embodiment of the CNT transistor. The IC (200) is formed on a substrate (202), as described in reference to FIG. 1A, which includes an isolation layer (204). Single crystal silicon seed layers (206) of substantially equal width are formed on a top surface of the isolation layer (204) by a process sequence as described in reference to FIG. 1A through FIG. 1E. Single wall thickness CNT transistor bodies (208) of substantially equal diameter and chirality are formed on top surfaces of the seed layers (206) by a process sequence as described in reference to FIG. 1F and FIG. 1G. The conductivity type, n-type or p-type, of the CNT transistor bodies (208) may be established with subsequent processing. The CNT transistor bodies (208) are electrically connected to silicided source/drain regions, not shown in FIG. 2 for clarity. A gate dielectric layer (210) is formed in a conformal manner on exterior surfaces of the CNT transistor bodies (208) as described in reference to FIG. 1H. In the instant embodiment, the CNT transistor bodies (208) are laterally spaced such that gate dielectric material in the gate dielectric layer (210) bridges gaps between adjacent CNT transistor bodies (208). The CNT transistor of the instant embodiment may be n-channel or p-channel according to process operations executed on the CNT transistor bodies (208).

Still referring to FIG. 2, a transistor gate (212) is formed on an exterior surface of the gate dielectric layer (210), as described in reference to FIG. 1I. Including more than one CNT transistor body (208) desirably increases a current capacity of the instant embodiment. Spacing the CNT transistor bodies (208) so that gate dielectric material bridges the gaps between adjacent CNT transistor bodies (208) desirably allows planar gate material formation processes to be employed in forming the transistor gate (212).

Figure 3A:
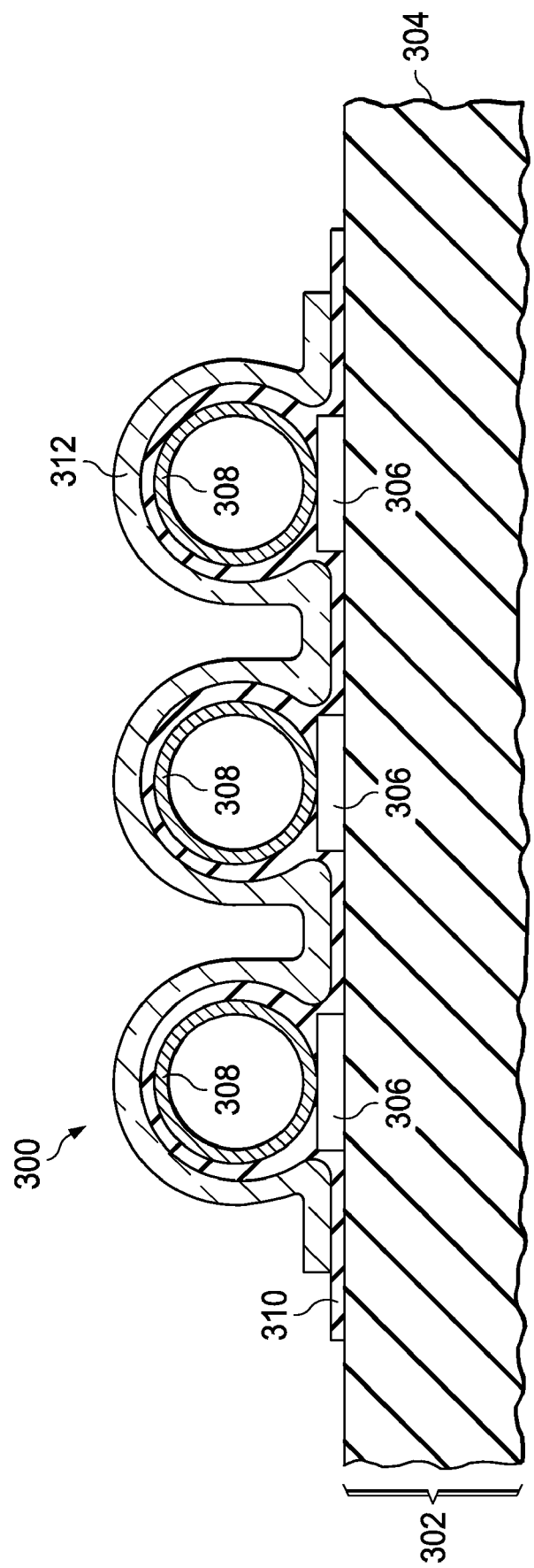
FIG. 3 is a cross-section of an IC containing a third embodiment of the CNT transistor.
Figure 3B:
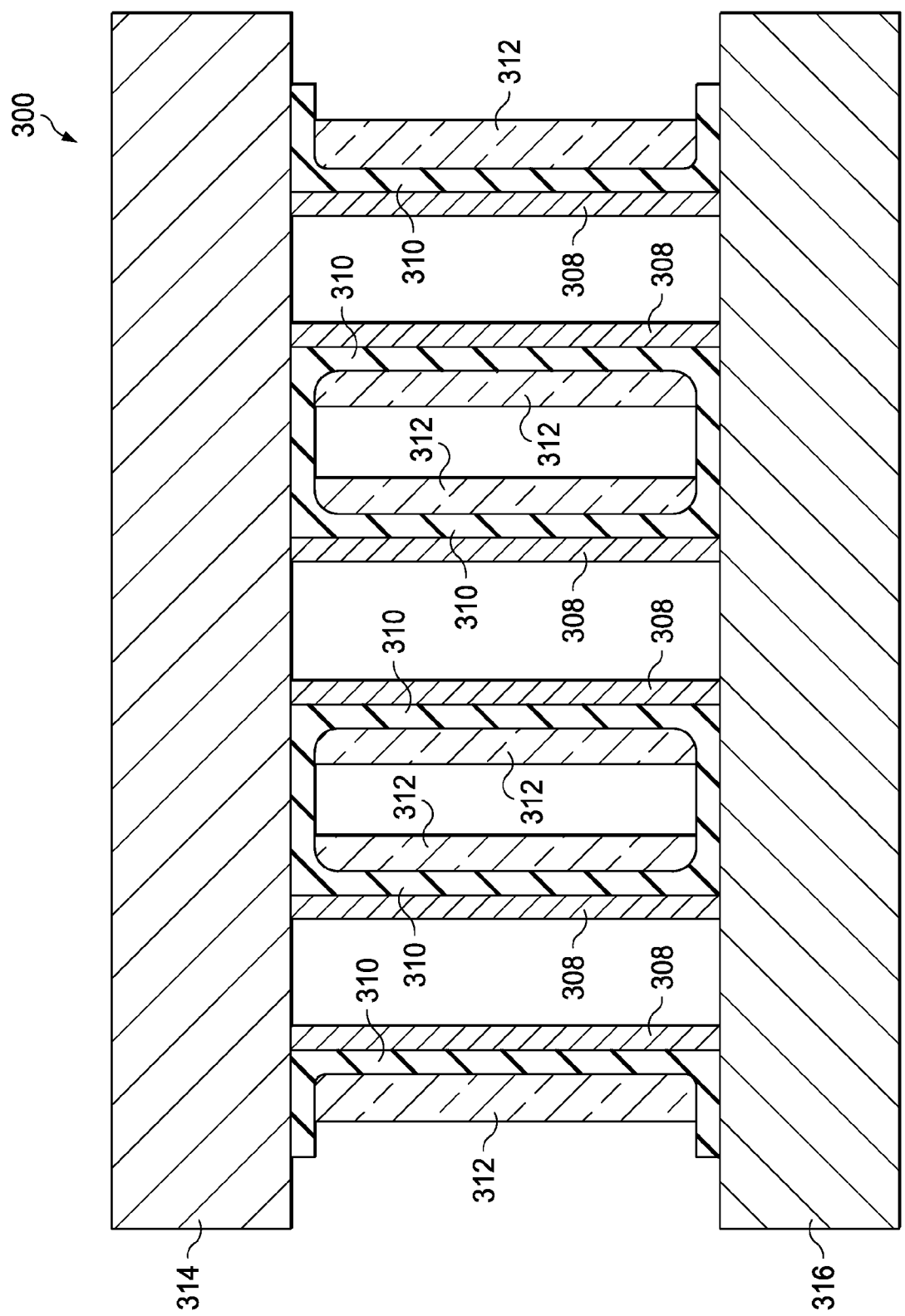

FIG. 3 is a cross-section of an IC containing a third embodiment of the CNT transistor. The IC (300) is formed on a substrate (302), as described in reference to FIG. 1A, which includes an isolation layer (304). Single crystal silicon seed layers (306) of substantially equal width are formed on a top surface of the isolation layer (304) by a process sequence as described in reference to FIG. 1A through FIG. 1E. Single wall thickness CNT transistor bodies (308) of substantially equal diameter and chirality are formed on top surfaces of the seed layers (306) by a process sequence as described in reference to FIG. 1F and FIG. 1G. The conductivity type, n-type or p-type, of the CNT transistor bodies (308) may be established with subsequent processing. The CNT transistor bodies (308) are electrically connected to silicided source/drain regions, not shown in FIG. 3 for clarity. A gate dielectric layer (310) is formed in a conformal manner on exterior surfaces of the CNT transistor bodies (308) as described in reference to FIG. 1H. In the instant embodiment, the CNT transistor bodies (308) are laterally spaced such that gate dielectric material in the gate dielectric layer (310) does not bridge gaps between adjacent CNT transistor bodies (308), and leaves sufficient space for gate material to be deposited on the gate dielectric layer (310) covering a majority of the CNT transistor bodies (308).

Still referring to FIG. 3, a transistor gate (312) is formed on an exterior surface of the gate dielectric layer (310), as described in reference to FIG. 1I. Spacing the CNT transistor bodies (308) so that gate material covers a majority of the CNT transistor bodies (308) desirably increases a current capacity of the instant embodiment above an alternate embodiment in which gate material does not cover a majority of CNT transistor bodies. The CNT transistor of the instant embodiment may be n-channel or p-channel according to process operations executed on the CNT transistor bodies (308).

Figure 4E:
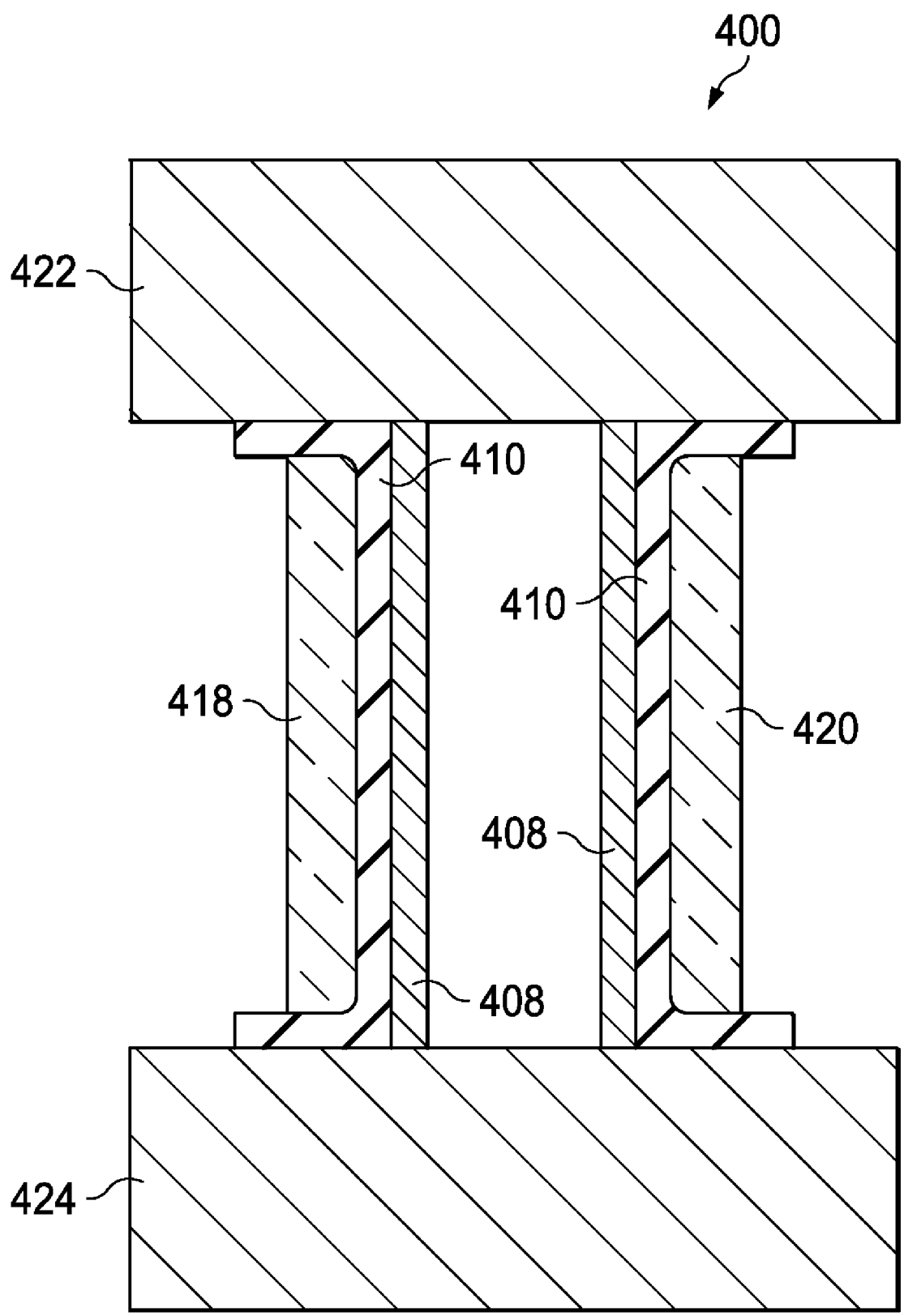

FIG. 4A through FIG. 4D are cross-sections of an IC containing a split gate CNT transistor in a fourth embodiment of the instant invention, depicted in successive stages of fabrication. Referring to FIG. 4A, the IC (400) is formed on a substrate (402), as described in reference to FIG. 1A, which includes an isolation layer (304). A single crystal silicon seed layer (406) of a desired width is formed on a top surface of the isolation layer (404) by a process sequence as described in reference to FIG. 1A through FIG. 1E. A single wall thickness CNT transistor body (408) of a desired diameter and chirality is formed on a top surface of the seed layer (406) by a process sequence as described in reference to FIG. 1F and FIG. 1G. The conductivity type, n-type or p-type, of the CNT transistor body (408) may be established with subsequent processing. The CNT transistor body (408) is electrically connected to silicided source/drain regions, not shown in FIG. 4A for clarity. A gate dielectric layer (410) is formed in a conformal manner on exterior surface of the CNT transistor body (408) as described in reference to FIG. 1H. A transistor gate (412) is formed on an exterior surface of the gate dielectric layer (410), as described in reference to FIG. 1I.

FIG. 4B depicts the IC (400) during the first part of a gate splitting operation. A planarizing layer (414), for example an organic polymer, is formed on an existing top surface of the IC (400), for example by using known methods of spin coating. A top surface of the planarizing layer (414) is substantially flat within 20 nanometers across the CNT transistor area. The IC (400) is then exposed to etchants (416) produced by a plasma, for example containing fluorine. The etchants (416) and conditions of generating the plasma are selected so that material from the planarizing layer (414) is removed at substantially a same rate as material from the transistor gate (412).

FIG. 4C depicts the IC (400) near the end of the gate splitting operation. The etchants (416) have removed material from the planarizing layer (414) and the transistor gate (412) such that the transistor gate (412) is split into two disconnected gate regions which contact a left side and a right side of the gate dielectric layer (410). The planarizing layer (414) is subsequently removed without further removal of a substantial amount of material from the transistor gate (412) or the gate dielectric layer (410), using known methods, for example, dissolving the planarizing layer (414) in solvents.

FIG. 4D depicts the IC (400) after fabrication of the split gate CNT transistor according to the instant embodiment is completed, which features a left-side transistor gate (418) and an opposing right-side transistor gate (420). A split gate configuration in a CNT transistor is advantageous because higher logic gate density is enabled. The CNT transistor of the instant embodiment may be n-channel or p-channel according to process operations executed on the CNT transistor body (408). Other methods of forming the left-side transistor gate (418) and an opposing right-side transistor gate (420) are within the scope of the instant invention.

Figure 5A:
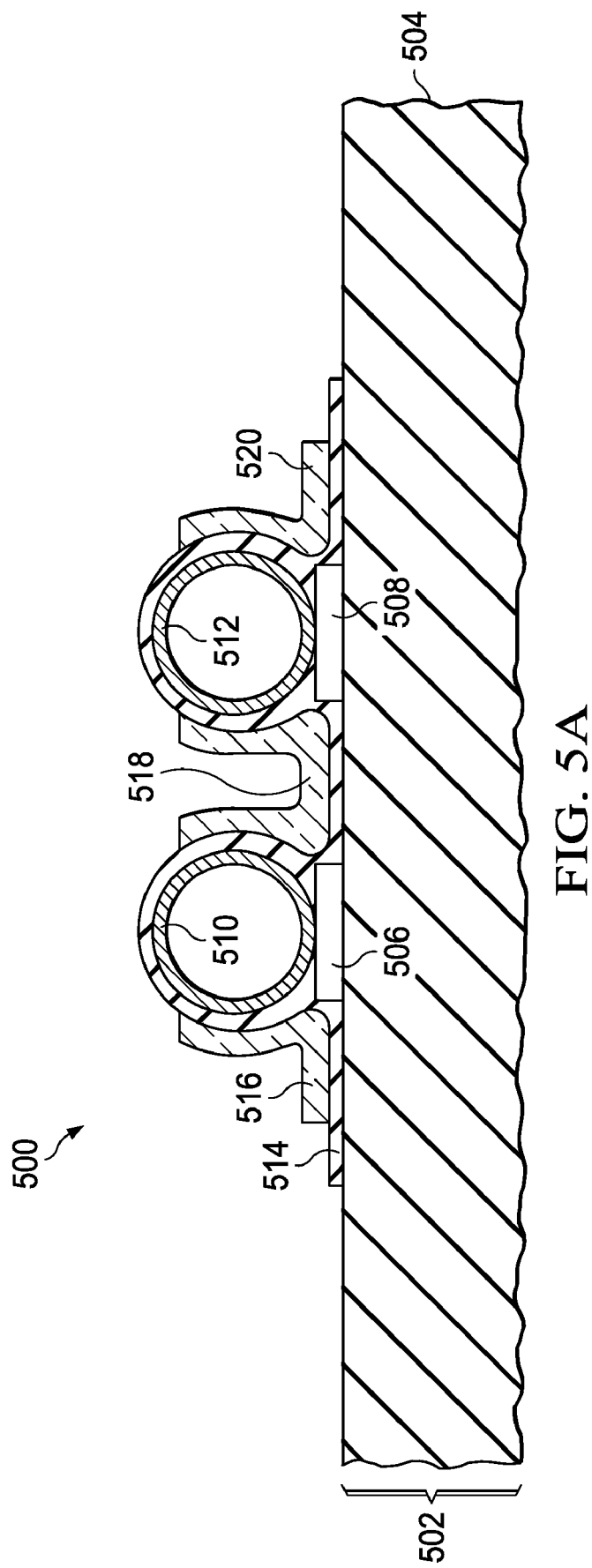
FIG. 5 is a cross-section of an IC containing a dual body split gate CNT transistor formed according to a fifth embodiment of the instant invention.
Figure 5B:
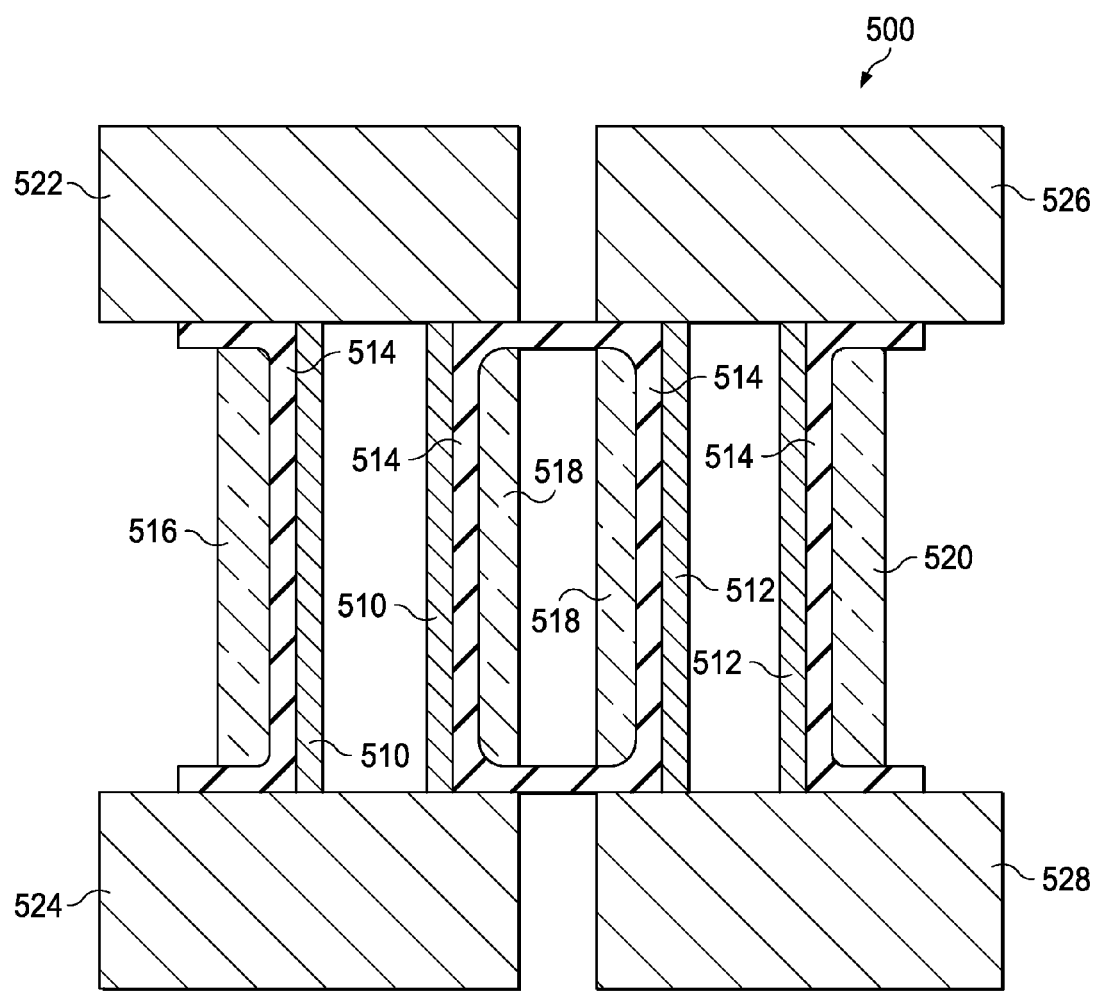

FIG. 5 is a cross-section of an IC containing a dual body split gate CNT transistor formed according to a fifth embodiment of the instant invention. The IC (500) is formed on a substrate (502), as described in reference to FIG. 1A, which includes an isolation layer (504). A left-side single crystal silicon seed layer (506) and a right-side single crystal silicon seed layer (508) having substantially equal widths, are formed on a top surface of the isolation layer (504) by a process sequence as described in reference to FIG. 1A through FIG. 1E. A single wall thickness left-side CNT transistor body (510) and a single wall thickness right-side CNT transistor body (512) having substantially equal diameters and chirality are formed on top surfaces of the left-side seed layer (506) and the right-side seed layer (508), respectively, by a process sequence as described in reference to FIG. 1F and FIG. 1G. The CNT transistor bodies (510, 512) may be both n-type, both p-type, or one n-type and one p-type, as established with subsequent processing. The left-side CNT transistor body (510) is electrically connected to left-side silicided source/drain regions and the right-side CNT transistor body (512) is electrically connected to right-side silicided source/drain regions, possibly connected to the left-side silicided source/drain regions. The silicided source/drain regions are out of the plane of FIG. 5, and hence are not shown in FIG. 5 for clarity. A gate dielectric layer (514) is formed in a conformal manner on exterior surfaces of the CNT transistor bodies (510, 512) as described in reference to FIG. 1H. In the instant embodiment, the CNT transistor bodies (510, 512) are laterally spaced such that gate dielectric material in the gate dielectric layer (514) does not bridge a gap between the left-side CNT transistor body (510) and the right-side transistor body (512), leaving sufficient space for gate material to be deposited on the gate dielectric layer (514) covering a majority of the CNT transistor bodies (510, 512).

Continuing to refer to FIG. 5, a left-side transistor split gate (516) is formed on an exterior surface of the gate dielectric layer (514) on a left side of the left-side CNT transistor body (510), by the process sequence described in reference to FIG. 4A through FIG. 4D. Concurrently with the left-side transistor split gate (516), a center transistor split gate (518) is formed on the exterior surface of the gate dielectric layer (514) on a right side of the left-side CNT transistor body (510) and a left side of the right-side CNT transistor body (512), and a right-side transistor split gate (520) is formed on the exterior surface of the gate dielectric layer (514) on a right side of the right-side CNT transistor body (512). The left-side transistor split gate (516), the center transistor split gate (518) and the right-side transistor split gate (520) are electrically disconnected from each other. A split gate configuration of a dual body CNT transistor is advantageous in a variety of circuits, for example in a static random access memory (SRAM) cell or a current mirror circuit.

Figure 6A:
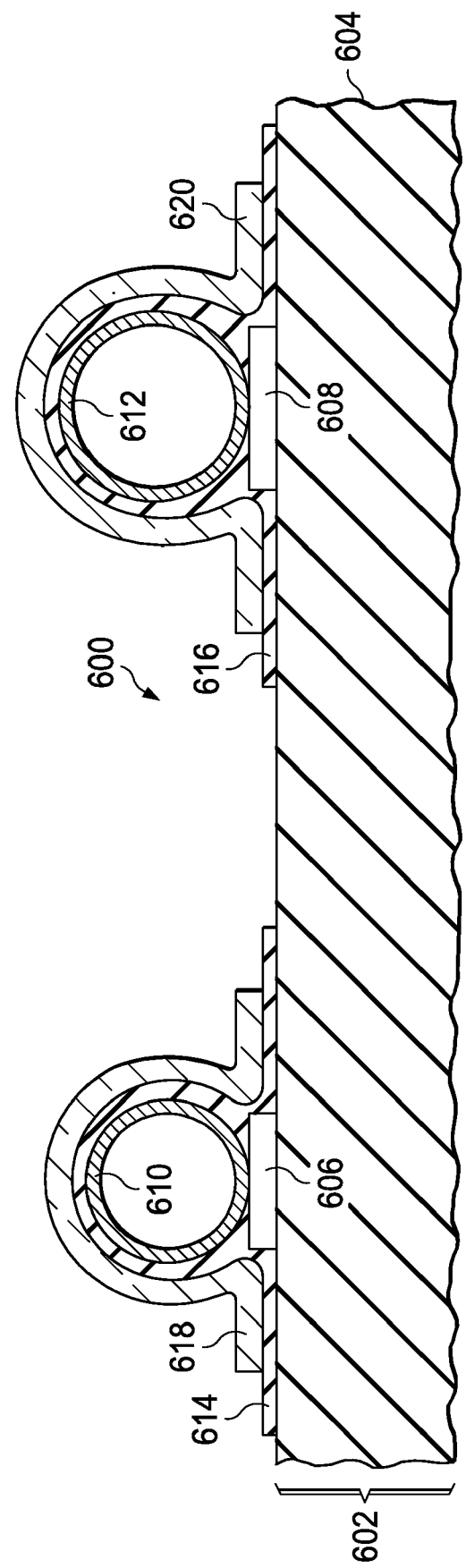
FIG. 6 is a cross-section of an IC containing two CNT transistors with different diameter bodies, formed according to the instant invention.
Figure 6B:
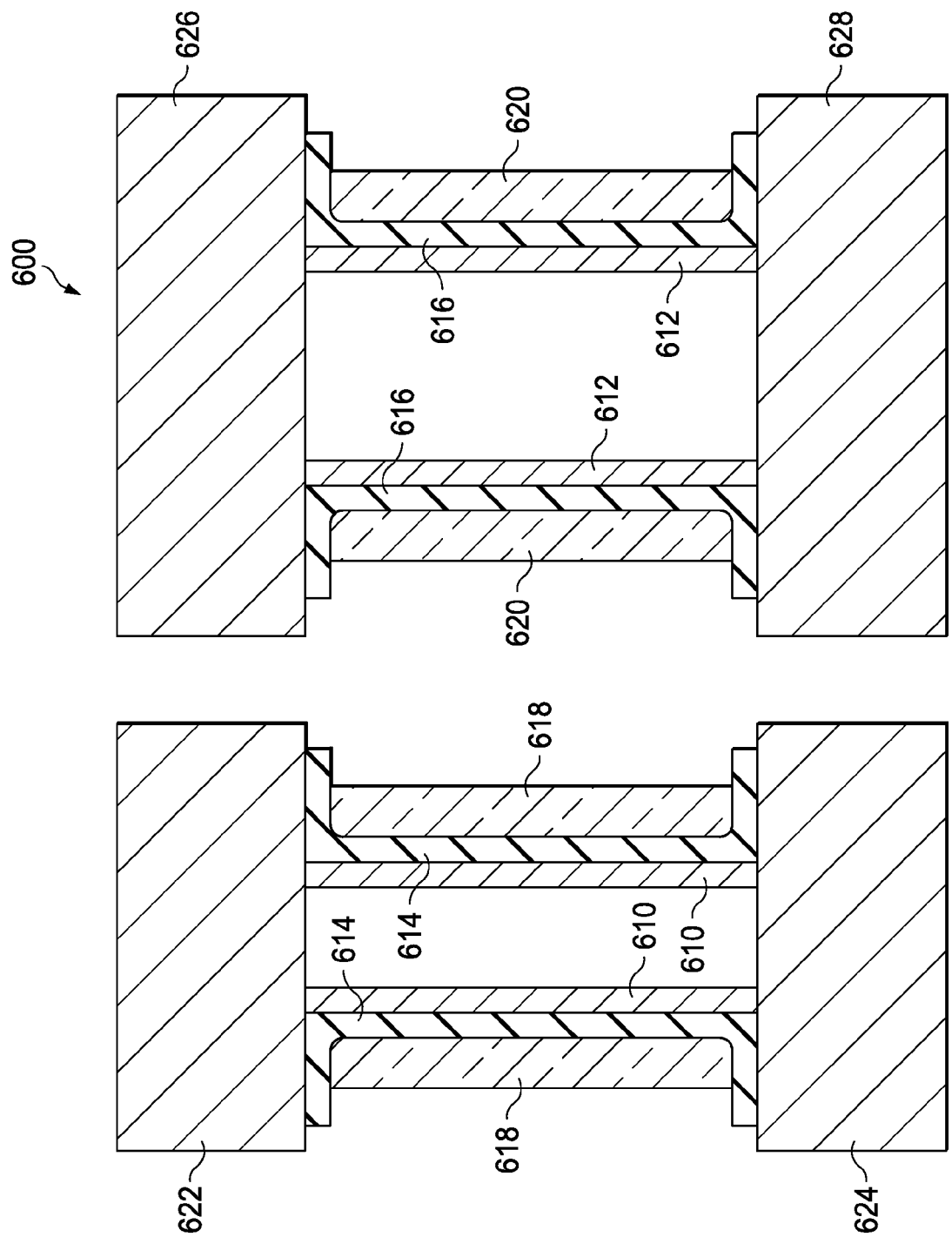

FIG. 6 is a cross-section of an IC containing two CNT transistors with different diameter bodies, formed according to the instant invention. The IC (600) is formed on a substrate (602), as described in reference to FIG. 1A, which includes an isolation layer (604). A first single crystal silicon seed layer (606) of a first width is formed on a top surface of the isolation layer (604) by a process sequence as described in reference to FIG. 1A through FIG. 1E. Concurrently with the first seed layer (606), a second single crystal silicon seed layer (608) of a second width, significantly different from the first width, is formed on the top surface of the isolation layer (604). A first single wall thickness CNT transistor body (610) of a first diameter established by the first width of the first seed layer (606), is formed on a top surface of the first seed layer (606) by a process sequence as described in reference to FIG. 1F and FIG. 1G. Concurrently with the first CNT transistor body (610), a second single wall thickness CNT transistor body (612) of a second diameter established by the second width of the second seed layer (608), and significantly different from the first diameter, is formed on a top surface of the first seed layer (606). The CNT transistor bodies (610, 612) may be both n-type, both p-type, or one n-type and one p-type, as established with subsequent processing. The first CNT transistor body (610) is electrically connected to a first set of silicided source/drain regions and the second CNT transistor body (612) is electrically connected to a second set of silicided source/drain regions. The silicided source/drain regions are out of the plane of FIG. 6, and hence are not shown in FIG. 6 for clarity. A first gate dielectric layer (614) is formed in a conformal manner on an exterior surface of the first CNT transistor body (610), and a second gate dielectric layer (616) is formed in a conformal manner on an exterior surface of the second CNT transistor body (612), as described in reference to FIG. 1H. A first transistor gate (618) is formed on an exterior surface of the first gate dielectric layer (614), and a second transistor gate (620) is formed on an exterior surface of the second gate dielectric layer (616), as described in reference to FIG. 1I. A first CNT transistor includes the first CNT transistor body (610), the first set of silicided source/drain regions, the first gate dielectric layer (614), and the first transistor gate (618). Similarly, a second CNT transistor includes the second CNT transistor body (612), the second set of silicided source/drain regions, the second gate dielectric layer (616), and the second transistor gate (620). Transistor performance parameters, such as on-state drive current, off-state leakage current, and threshold voltage, may be significantly different for the two CNT transistors of the instant embodiment due to the significant difference in diameters of the CNT transistor bodies (610, 612). This is advantageous in ICs with circuits whose performance is optimized at different values of transistor parameters. For example, logic circuits run faster when transistor thresholds are relatively low, between one-fourth and one-third of a circuit operating voltage, while SRAM cells are more reliable when transistor thresholds are relatively high, around one-half of the circuit operating voltage. Concurrent formation of CNT transistors with significantly different transistor performance parameters in the IC (600) is advantageous because it enables increased IC performance at lower fabrication cost. Each CNT transistor of the instant embodiment may be n-channel or p-channel according to process operations executed on the CNT transistor bodies (610, 612).

What is claimed is:

1. A method of forming an integrated circuit, comprising the steps of:
   forming an SWT CNT transistor, by a process further comprising the steps of:
      forming a patterned seed layer comprising single crystal silicon on a top surface of an isolating layer;
      forming a first silicided source/drain regions at a first end of said silicon seed layer;
      forming a second silicided source/drain regions at a second end of said silicon seed layer;
      converting said silicon seed layer to a single crystal silicon carbide seed layer;
      forming an SWT CNT transistor body on a top surface of said silicon carbide seed layer by a process further comprising the steps of:
         forming a single layer of graphene on a top surface of said silicon carbide seed layer; and
         forming a CNT transistor body from said graphene layer by heating said graphene layer between 1100 C and 1400 C while exposing said graphene layer to carbon containing gases;
      forming a gate dielectric layer on an exterior surface of said SWT CNT transistor body; and
      forming a transistor gate on a surface of said gate dielectric layer over said SWT CNT transistor body.

2. The method of claim 1, in which:
   said step of forming said SWT CNT transistor further comprises the steps of:
      forming a second patterned single crystal silicon seed layer on said top surface of said isolation layer, adjacent to said first silicon seed layer, in a manner such that a first end of said second silicon seed layer contacts said first silicided source/drain region and a second end of said second silicon seed layer contacts said second silicided source/drain region;
      converting said second silicon seed layer to a second single crystal silicon carbide seed layer; and
      forming a second SWT CNT transistor body on a top surface of said second silicon carbide seed layer;
   said step of forming said gate dielectric layer is performed such that said gate dielectric layer contacts an exterior surface of said second SWT CNT transistor body and bridges a gap between said first SWT CNT transistor body and said second SWT CNT transistor body; and
   said step of forming said transistor gate is performed such that said transistor gate overlaps said second SWT CNT transistor body.

3. The method of claim 1, in which:
   said step of forming a SWT CNT transistor further comprises the steps of:
      forming a second patterned single crystal silicon seed layer on said top surface of said isolation layer, such that a first end of said second silicon seed layer contacts said first silicided source/drain region and a second end of said second silicon seed layer contacts said second silicided source/drain region;
      converting said second silicon seed layer to a second single crystal silicon carbide seed layer; and
      forming a second SWT CNT transistor body on a top surface of said second silicon carbide seed layer;
   said step of forming said gate dielectric layer is performed in a manner such that said gate dielectric layer contacts more than three-fourths of said exterior surface of said first SWT CNT transistor body;
   said step of forming said gate dielectric layer is performed in a manner such that said gate dielectric layer contacts more than three-fourths of an exterior surface of said second SWT CNT transistor body;
   said step of forming said transistor gate is performed in a manner such that said transistor gate overlaps more than three-fourths of said exterior surface of said first SWT CNT transistor body; and
   said step of forming said transistor gate is performed in a manner such that said transistor gate overlaps more than three-fourths of said exterior surface of said second SWT CNT transistor body.

4. The method of claim 1, further comprising the step of forming a second transistor gate, distinct from said first transistor gate, on said surface of said gate dielectric layer over said SWT CNT transistor body.

5. The method of claim 4, in which:
   said step of forming said SWT CNT transistor further comprises the steps of:

forming a second patterned single crystal silicon seed layer on said top surface of said isolation layer;
forming a third silicided source/drain region at a first end of said second silicon seed layer;
forming a fourth silicided source/drain region at a second end of said second silicon seed layer;
converting said second silicon seed layer to a second single crystal silicon carbide seed layer;
forming a second SWT CNT transistor body on a top surface of said second silicon carbide seed layer;
forming a second gate dielectric layer on an exterior surface of said second SWT CNT transistor body; and
forming a third transistor gate, distinct from said first transistor gate and from said second transistor gate, on a surface of said second gate dielectric layer over said second SWT CNT transistor body; and
said step of forming said second transistor gate is performed in a manner such that said second transistor gate contacts said surface of said second gate dielectric layer over said second SWT CNT transistor body.

6. The method of claim 1, further comprising the step of forming a second SWT CNT transistor, further comprising the steps of:

forming a second patterned single crystal silicon seed layer on said top surface of said isolation layer, wherein a width of said second patterned silicon seed layer is significantly different from a width of said first patterned silicon seed layer;
forming a third silicided source/drain region at a first end of said second silicon seed layer;
forming a fourth silicided source/drain region at a second end of said second silicon seed layer;
converting said second silicon seed layer to a second single crystal silicon carbide seed layer;
forming a second SWT CNT transistor body on a top surface of said second silicon carbide seed layer, wherein a diameter of said second SWT CNT transistor body is significantly different from a diameter of said first SWT CNT transistor body;
forming a second gate dielectric layer on an exterior surface of said second SWT CNT transistor body; and
forming a second transistor gate on a surface of said second gate dielectric layer over said second SWT CNT transistor body.

* * * * *